US008578253B2

(12) United States Patent  (10) Patent No.: US 8,578,253 B2
Yang et al.  (45) Date of Patent: Nov. 5, 2013

(54) SYSTEMS AND METHODS FOR UPDATING DETECTOR PARAMETERS IN A DATA PROCESSING CIRCUIT

(75) Inventors: Shaohua Yang, Santa Clara, CA (US); Jonseung Park, Allentown, PA (US); Changyou Xu, Fremont, CA (US); Madhusudan Kalluri, Sunnyvale, CA (US); Yuan Xing Lee, San Jose, CA (US); Kapil Gaba, Fremont, CA (US)

(73) Assignee: LSI Corporation, San Jose, CA (US)

( * ) Notice: Subject to any disclaimer, the term of this patent is extended or adjusted under 35 U.S.C. 154(b) by 893 days.

(21) Appl. No.: 12/651,956

(22) Filed: Jan. 4, 2010

(65) Prior Publication Data

US 2011/0167227 A1  Jul. 7, 2011

(51) Int. Cl.
*H03M 13/00*  (2006.01)

(52) U.S. Cl.
USPC ........................................................ 714/795

(58) Field of Classification Search
USPC ........................... 714/795; 711/154, E12.001
See application file for complete search history.

(56) References Cited

U.S. PATENT DOCUMENTS

| | | | |
|---|---|---|---|
| 5,278,846 A | 1/1994 | Okayama et al. | |
| 5,325,402 A | 6/1994 | Ushirokawa | |
| 5,392,299 A | 2/1995 | Rhines et al. | |
| 5,513,192 A | 4/1996 | Janku et al. | |
| 5,612,964 A | 3/1997 | Haraszti | |
| 5,701,314 A | 12/1997 | Armstrong et al. | |
| 5,717,706 A | 2/1998 | Ikeda | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |

(Continued)

FOREIGN PATENT DOCUMENTS

| | | |
|---|---|---|
| WO | WO 2006/016751 | 2/2006 |
| WO | WO 2006/091797 | 8/2007 |

OTHER PUBLICATIONS

Casado et al., Multiple-rate low-density parity-check codes with constant blocklength, IEEE Transations on Communications, Jan. 2009, vol. 57, pp. 75-83.

(Continued)

*Primary Examiner* — Ajay Bhatia
*Assistant Examiner* — Thien D Nguyen
(74) *Attorney, Agent, or Firm* — Hamilton DeSanctis & Cha

(57) ABSTRACT

Various embodiments of the present invention provide systems and methods for updating detector parameters in a data processing circuit. For example, a data processing circuit is disclosed that includes a first detector circuit, a second detector circuit, and a calibration circuit. The first detector circuit is operable to receive a first data set and to apply a data detection algorithm to the first data set, and the second detector circuit is operable to receive a second data set and to apply the data detection algorithm to the second data set. The calibration circuit is operable to calculate a data detection parameter based upon a third data set. The data detection parameter is used by the first detector circuit in applying the data detection algorithm to the first data set during a period that the data detection parameter is used by the second detector circuit in applying the data detection algorithm to the second data set.

20 Claims, 3 Drawing Sheets

(56) References Cited

U.S. PATENT DOCUMENTS

| | | | |
|---|---|---|---|
| 6,029,264 | A | 2/2000 | Kobayashi et al. |
| 6,041,432 | A | 3/2000 | Ikeda |
| 6,097,764 | A | 8/2000 | McCallister et al. |
| 6,216,251 | B1 | 4/2001 | McGinn |
| 6,266,795 | B1 | 7/2001 | Wei |
| 6,317,472 | B1 | 11/2001 | Choi et al. |
| 6,351,832 | B1 | 2/2002 | Wei |
| 6,377,610 | B1 | 4/2002 | Hagenauer et al. |
| 6,438,717 | B1 | 8/2002 | Butler et al. |
| 6,473,878 | B1 | 10/2002 | Wei |
| 6,625,775 | B1 | 9/2003 | Kim |
| 6,671,404 | B1 | 12/2003 | Kawatani et al. |
| 6,748,034 | B2 | 6/2004 | Hattori et al. |
| 6,757,862 | B1 | 6/2004 | Marianetti |
| 6,788,654 | B1 | 9/2004 | Hashimoto et al. |
| 6,810,502 | B2 | 10/2004 | Eidson |
| 6,986,098 | B2 | 1/2006 | Poeppelman |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,093,179 | B2 | 8/2006 | Shea |
| 7,184,486 | B1 | 2/2007 | Wu et al. |
| 7,191,378 | B2 | 3/2007 | Eroz et al. |
| 7,203,887 | B2 | 4/2007 | Eroz et al. |
| 7,257,764 | B2 | 8/2007 | Suzuki et al. |
| 7,310,768 | B2 | 12/2007 | Eidson et al. |
| 2004/0098659 | A1 | 5/2004 | Bjerke et al. |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0140311 | A1 | 6/2006 | Ashley et al. |
| 2006/0168493 | A1 | 7/2006 | Song et al. |
| 2006/0195772 | A1 | 8/2006 | Graef et al. |
| 2006/0248435 | A1 | 11/2006 | Haratsch |
| 2007/0011569 | A1 | 1/2007 | Vila Casado et al. |
| 2007/0047635 | A1 | 3/2007 | Stojanovic et al. |
| 2007/0286270 | A1 | 12/2007 | Huang et al. |
| 2008/0049825 | A1 | 2/2008 | Chen et al. |
| 2008/0168330 | A1 | 7/2008 | Graef et al. |
| 2009/0327832 | A1* | 12/2009 | Ichihara ................... 714/752 |
| 2010/0070837 | A1* | 3/2010 | Xu et al. ................... 714/799 |
| 2010/0226227 | A1* | 9/2010 | Yu et al. ................... 369/53.15 |
| 2011/0072335 | A1* | 3/2011 | Liu et al. ................... 714/796 |

OTHER PUBLICATIONS

Collins and Hizlan, "Determinate State Convolutional Codes" IEEE Transactions on Communications, Dec. 1993.

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

Zhong, "Block-LDPC: A Practical LDPC Coding System Design Approach", IEEE Trans. on Circuits, Regular Papers, vol. 5, No. 4, pp. 766-775, Apr. 2005.

* cited by examiner

SYSTEMS AND METHODS FOR UPDATING DETECTOR PARAMETERS IN A DATA PROCESSING CIRCUIT

BACKGROUND OF THE INVENTION

The present inventions are related to systems and methods for performing data calibration in an out of order data processing system.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any data losses caused by various factors. In some cases, an encoding/decoding process is used to enhance the ability to detect a data error and to correct such data errors. As an example, a simple data detection and decode may be performed, however, such a simple process often lacks the capability to converge on a corrected data stream.

To heighten the possibility of convergence, various existing processes utilize two or more detection and decode iterations. Such an approach assures that at least two detection and decoding processes are applied to each presented data set. However, such an approach absolutely requires two iterations for each input data set that is introduced. This may waste significant power and introduce unnecessary latency where the input is capable of converging in a single iteration. Further, in some cases two iterations is insufficient to result in a convergence. Thus, such an approach is both wasteful in some conditions and insufficient in other conditions.

Hence, for at least the aforementioned reasons, there exists a need in the art for advanced systems and methods for data processing.

BRIEF SUMMARY OF THE INVENTION

The present inventions are related to systems and methods for performing data calibration in an out of order data processing system.

Various embodiments of the present invention provide data processing circuits. Such data processing circuits include a first detector circuit, a second detector circuit, and a calibration circuit. The first detector circuit is operable to receive a first data set and to apply a data detection algorithm to the first data set, and the second detector circuit is operable to receive a second data set and to apply the data detection algorithm to the second data set. The calibration circuit is operable to calculate a data detection parameter based upon a third data set. The data detection parameter is used by the first detector circuit in applying the data detection algorithm to the first data set during a period that the data detection parameter is used by the second detector circuit in applying the data detection algorithm to the second data set. In various instances of the aforementioned embodiments, the data processing circuit further includes a decoding circuit that is operable to: receive a first detected output from the first detector circuit, apply a decoding algorithm to the first detected output, and to provide the second data set; and receive a second detected output from the second detector circuit, apply a decoding algorithm to the second detected output, and to provide a fourth data set.

In some instances of the aforementioned embodiments, the circuit further includes a memory that is operable to store the data detection parameter. In some such cases, the first detector circuit is operable to receive the data detection parameter directly from the calibration circuit, and the second detector circuit is operable to receive the data detection parameter directly from the memory. In one or more cases, the first detector circuit begins processing the first data set before the second detector circuit begins processing the second data set.

In various instances of the aforementioned embodiments, the first detector circuit applies the detection algorithm to the second data set before the second detector circuit applies the detection algorithm to the second data set. In such cases, the data processing circuit is an out of order data processing circuit that is capable of finishing processing of the first data set before the second data set.

In one or more embodiments of the present invention, the calibration circuit includes a noise predictive finite impulse response filter. In some instances of the aforementioned embodiments, the calibration circuit adaptively calculates the data detection parameter based upon the third data set and at least one preceding data set. The at least one preceding data set may include the first data set, the second data set, or both the first data set and second data set.

Other embodiments of the present invention provide methods for updating detector parameters in a data processing circuit. The methods include calculating a data detection parameter based at least in part on a first data set; applying a data detection algorithm using a first data detector circuit to a second data set using the data detection parameter; applying the data detection algorithm using the first data detector circuit to a third data set; and applying the data detection algorithm using a second data detector circuit to the third data set using the data detection parameter during a period that the first data detector circuit applies the data detection algorithm to the second data set. Applying the data detection algorithm to the third data set by the first data detector circuit is done before applying the data detection algorithm to the second data set by the second detector circuit.

In some instances of the aforementioned embodiments, calculating the data detection parameter is done by a calculation circuit, and the method further includes storing the data detection parameter in a memory. In such cases, the second detector circuit receives the data detection parameter from the memory, and the first detector circuit receives the data detection parameter directly form the calculation circuit. In some cases, the first detector circuit receives the data detection parameter directly from the calibration circuit, and the second detector circuit receives the data detection parameter directly from the memory. In particular cases, the first detector circuit begins applying the data detection algorithm to the second data set before the second detector circuit begins applying the data detection algorithm to the third data set.

In various instances of the aforementioned embodiments, the methods further include applying a decoding algorithm by a decoder circuit to the third data set after applying the data detection algorithm by the first data detector circuit to the third data set, and before applying the data detection algorithm by the second data detector circuit to the third data set. In some instances of the aforementioned embodiments, the decoding algorithm is a low density parity check decoding algorithm, and the detection algorithm is either a Viterbi algorithm detection algorithm or a maximum a posteriori detector algorithm.

Yet other embodiments of the present invention provide storage systems that include a storage medium; a read/write head assembly disposed in relation to the storage medium; and a read channel circuit. The storage medium stores a first data set, a second data set and a third data set. The read channel circuit is operable to receive the first data set, the second data set and the third data set via the read/write head assembly. The read channel circuit includes a first detector circuit, a second detector circuit and a calibration circuit. The first detector circuit is operable to receive the first data set and to apply a data detection algorithm to the first data set. The second detector circuit is operable to receive the second data set and to apply the data detection algorithm to the second data set. The calibration circuit is operable to calculate a data detection parameter based upon the third data set. The data detection parameter is used by the first detector circuit in applying the data detection algorithm to the first data set during a period that the data detection parameter is used by the second detector circuit in applying the data detection algorithm to the second data set.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for performing data calibration in an out of order data processing system.

Figure 1:
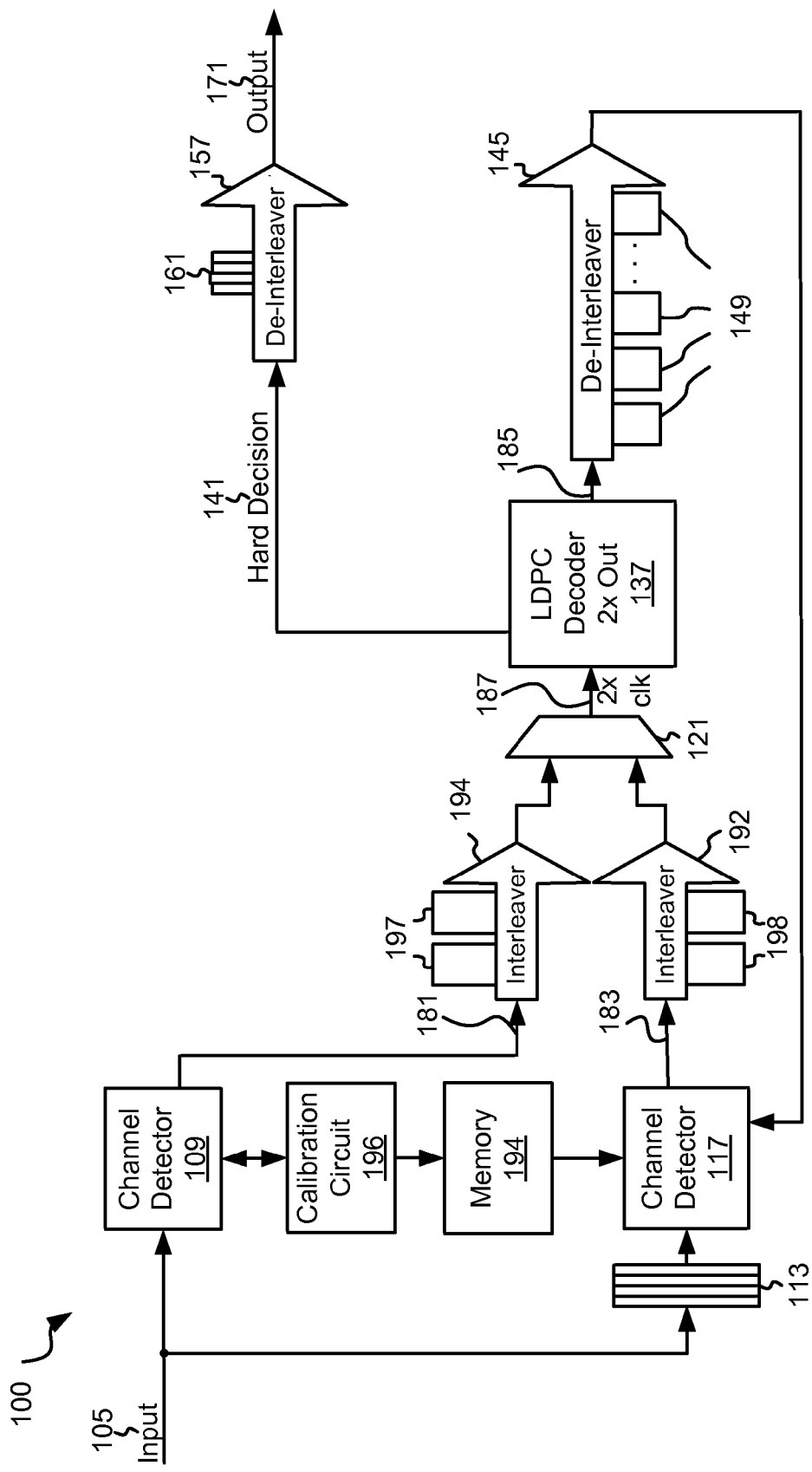
FIG. 1 shows a data processing circuit with out of order codeword processing circuitry and a feed forward calibration circuit in accordance with various embodiments of the present invention.

Turning to FIG. 1, a queuing detection and decoding circuit 100 including a feed forward calibration circuit is shown in accordance with various embodiments of the present invention. Queuing detection and decoding circuit 100 includes a data input 105 that is fed to a channel detector 109. In some embodiments, data input 105 may be derived from a storage medium. In particular cases, data input 105 is provided as groups of data or data sets that are sometimes referred to as codewords. In the case of a hard disk drive, the received data sets may be sectors of data from the storage medium of the hard disk drive. Based upon the disclosure provided herein, one of ordinary skill in the art will recognize other sources for data input, and other data sets that may be processed in accordance with different embodiments of the present invention.

Channel detector 109 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention.

In addition, data input 105 is provided to a memory buffer 113 that is designed to hold a number of data sets received from data input 105. The size of memory buffer 113 may be selected to provide sufficient buffering such that a data set provided via data input 105 remains available at least until a first iteration processing of that same data set is complete and the processed data is available in a queue buffer 149 as more fully described below. Memory buffer 113 provides the data sets to a channel detector 117. Similar to channel detector 109, channel detector 117 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

Additionally, data input 105 is provided to a feed forward calibration circuit that includes a calibration circuit 196 and a memory 194. Data sets provided via data input 105 are processed by calibration circuit 196 as is known in the art. In some embodiments of the present invention, calibration circuit 196 includes a noise predictive finite impulse response filter and a variance calibration training circuit as are known in the art. Calibration circuit 196 estimates the parameters used to compute the branch metrics of channel detector 109. These calculated parameters are referred to as data detection parameters. The data detection parameters are loaded into channel detector 109 at the end of each data set being processed by channel detector 109, and are used in performing detection of the subsequent data set received by channel detector 109 via input data 105. In addition, the calculated parameters are loaded into memory 194 at the end of each data set being processed by calibration circuit 196. The calculated parameters may then be used to compute the branch metrics of channel detector 117. Again, in some cases, the data set being processed is a codeword.

Memory 194 may be any storage device or circuitry known in the art. In one particular embodiment of the present invention, memory 194 is a single stage latch that receives the calculated parameters and holds them for processing in a subsequent channel detection process in channel detector 117. As the processing by channel detector 109 and channel detector 117 do not necessarily start at the same time (e.g., the start of codeword processing by channel detector 109 occurs at a different time than the start of codeword processing by channel detector 117), memory 194 holds the calculated data detection parameters for loading into channel detector 117 at the end of each data set being processed by channel detector 117.

An output 181 of channel detector 109 is provided to an interleaver circuit 194, and an output 183 of channel detector 117 is provided to another interleaver circuit 192. Interleaver circuit 194 interleaves the output of channel detector 109 using a ping pong buffer 197, and interleaver circuit 192 interleaves the output of channel detector 117 using a ping pong buffer 198. One of the buffers in ping pong buffer 197 holds the result of a prior interleaving process of the output from channel detector 109 and is unloaded to an LDPC decoder 137 via a multiplexer 121, while the other buffer of ping pong buffer 197 holds a data set from channel detector 109 that is currently being interleaved. Similarly, one of the buffers in ping pong buffer 198 holds the result of a prior interleaving process of the output from channel detector 117 and is unloaded to LDPC decoder 337 via a multiplexer 121, while the other buffer of ping pong buffer 198 holds a data set from channel detector 117 that is currently being interleaved. It should be noted that other soft decision data decoders may be used in place of LDPC decoder 137 in different embodiments of the present invention.

LDPC decoder 137 is capable of decoding one or more data sets simultaneously. As an example, LDPC decoder 137 may be designed to decode an interleaved data set from ping pong buffer 197, to decode an interleaved data set from ping pong buffer 198, or to decode interleaved data sets from ping pong buffer 197 and ping pong buffer 198 simultaneously. The decoded data is either provided as a hard decision output 141 or to a de-interleaver circuit 145 that uses queue buffer 149 to de-interleave the decoded data and to store the de-interleaved data until channel detector 117 is available for further processing.

Where the data converges, it is provided as a hard decision output 141. Alternatively, where the data fails to converge, the data is stored to queue buffer 149 until channel detector 117 is available for further processing. One of the buffers in queue buffer 149 holds the result of a prior de-interleaving process and is unloaded to channel detector 117, while another buffer of queue buffer 149 holds a decoded data set currently being de-interleaved, and one or more other buffers in queue buffer 149 maintain other non-converged data waiting for processing by channel detector 117. Non-converged data from queue buffer 149 is de-interleaved by de-interleaver 145 and passed to channel detector 117 that has access to the corresponding data set in memory buffer 113. The data detection performed by channel detector 117 is similar to that performed by channel detector 109. The data detection is done using the calculated parameters stored in memory 194. The calculated parameters are changed in memory 194 at the end of the processing of each data set by channel detector 109, and are loaded from memory 194 to channel detector 117 at the end of the processing of each data set by channel detector 117. Hard decision output 141 is provided to a de-interleaver circuit 157 that de-interleaves the received hard decision output 141 and stores the de-interleaved result in one of a number of memory buffers 161. Ultimately, de-interleaver circuit 157 provides the de-interleaved data stored in memory buffers 161 as an output 171. One function of de-interleaver 157 is to re-order the processed data sets so that they can be provided as an output in the same order that the corresponding data sets were originally received.

Queuing detection/decoding circuit 100 allows for performance of a variable number of detection and decoding iterations depending upon the introduced data. Further, in some cases, considerable power savings may be achieved through use of queuing detection/decoding circuit 100. Yet further, in some cases, a faster LDPC decoder may be implemented allowing for an increased throughput where substantial first iteration data convergence exists as multiple iterations are not necessarily required. Yet further, by allowing results of LDPC decoder 137 to be reported out of order, upstream processing does not have to wait for the completion of downstream processing. Re-ordering of the out of order results may be done by queuing detection/decoding circuit 100 or by a downstream recipient of output 171.

Where noise predictive calibration circuit 196 is a closed loop adaptive circuit as are known in the art, providing the most recent calculated parameters to both channel detector 109 and channel detector 117 assures that the most recent adaptation is available for performing data detection in channel detector 109 and channel detector 117. Further, providing the same calculated parameters to both channel detector 109 and channel detector 117, the circuitry may be minimized when compared to other circuits that use the calculated parameters in relation to the same data set as it is processed one or more times through channel detector 117.

In operation, a first data set is introduced via data input 105 to channel detector 109. Channel detector 109 performs its channel detection algorithm and provides both a hard output and a soft output to interleaver circuit 194 that interleaves the received data into one buffer of ping pong buffer 197. As the data detection process proceeds in channel detector 109, calibration circuit 196 performs a noise predictive calibration and variance calibration that calculates the parameters that will be used to compute the branch metrics of detector 109 and detector 117. At the end of processing the first data set, the calculated parameters are loaded into detector 109 for use in relation to processing a subsequent data set through channel detector 109, and into memory 194 for use in relation to processing a subsequent data set through channel detector 117.

Interleaver 194 may interleave the data set by writing consecutive data into non-consecutive memory/buffer addresses based on the interleaver algorithm/mapping. Interleaved data is provided from the other buffer of ping pong buffer 197 to LDPC decoder 137 via multiplexer 121. LDPC decoder 137 performs a data decoding process. Where the decoding process converges, LDPC decoder 137 writes its output as hard decision output 141 to output data buffer 161 and the processing is completed for that particular data set. Alternatively, where the data does not converge, LDPC decoder 137 writes its output (both soft and hard) to queue buffer 149. The scheduling guarantees that there is at least one empty buffer for holding this new set of data, and this strategy assures that each data input is guaranteed the possibility of at least two global iterations (i.e., two passes through a detector and decoder pair). As the LDPC decoding process proceeds, LDPC decoder 137 asserts LDPC processing start signal 124.

Where the data decoding process applied by LDPC decoder converges, the converging result is provided as a hard decision 141 to one of the buffers in memory buffer 161. The outputs are re-ordered and presented as output 171. Alternatively, where the data decoding process fails to converge, the non-converging data set is written to one of the buffers in queue buffer 149. Channel detector 117 selects the data set that corresponds to the output in queue buffer 149 from input data buffer 113 and performs a subsequent data detection aided by the soft output data generated by LDPC decoder 137 fed back from queue buffer 149. Before the channel detection process of channel detector 117 begins, the calculated parameters are loaded into channel detector 117 from memory 194. This assures that the most recent calculated parameters are used by channel detector 117. By using the previously generated soft data for data maintained in input data buffer 113, channel detector 117 generally performs a subsequent channel detection with heightened accuracy. The output of this subsequent channel detection is passed to interleaver circuit 192 that interleaves the received data into one buffer of ping pong buffer 198. Interleaver 192 may interleave the data set by writing consecutive data into non-consecutive memory/buffer addresses based on the interleaver algorithm/mapping. The interleaved data is provided from the other buffer of ping pong buffer 318 to LDPC decoder 137 via multiplexer 121. LDPC decoder 137 provides another decoding pass to the data. Similar to the first iteration, a decision is made as to whether the data converged. Where the data converged, LDPC decoder 137 writes its output as hard decision output 141 to output data buffer 161 and the processing is complete for that particular data set. Alternatively, where the data does not converge, LDPC decoder 137 writes its output (both soft and hard) to queue buffer 149 where it is passed back to channel detector 117 for another global iteration where such is necessary and possible.

Figure 2:
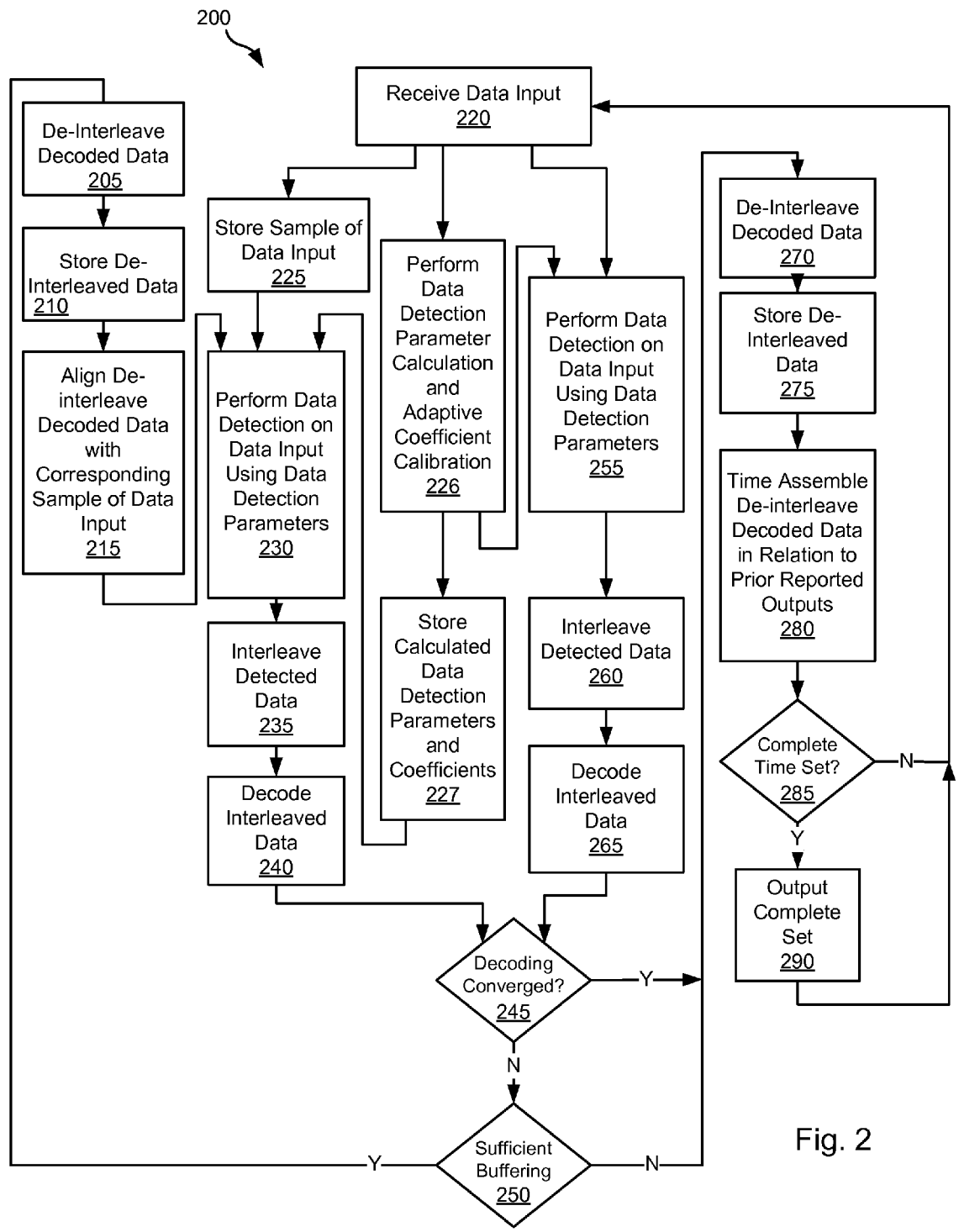
FIG. 2 is a flow diagram showing a method in accordance with some embodiments of the present invention for distributing calibration data in an out of order data processing circuit.

Turning to FIG. 2, a flow diagram 200 shows a method in accordance with some embodiments of the present invention for distributing calibration data in an out of order data processing circuit. Following flow diagram 200, a data input is received (block 220). This data input may be, but is not limited to, a series of data bits received from a magnetic recording medium or a series of bits received from a transmission channel. These series of data bits may be grouped into data sets. These data sets may include data grouped into a particular format and are referred to as codewords. For example, the data sets may include data assembled for low density parity check (LDPC) decoding that may be referred to as LDPC codewords. A sample of the received data is stored in a buffer and retained for later processing (block 225). In some cases, the data stored in the buffer is stored as a full sector of data, and the data buffer includes the ability to store multiple sectors of data.

In addition, a calibration process is performed on the received data input to calculate data detection parameters (block 226). The data detection parameters are used to compute the branch metrics in data detection processes. Calculation of such data detection parameters and use of the data detection parameters in the data detection processes are well known in the art. The process of calculating data detection parameters may include the use of noise predictive filters. The coefficients for the noise predictive filters are adaptively updated using previous values and the newly received data being processed by the noise predictive filters.

Data detection processes are performed on the received data to yield a detected data set (block 255). The data detection processes use data detection parameters calculated as part of block 226. The calculated data detection processes and coefficients are stored to a memory (block 227). These stored data detection parameters are used in relation to subsequent data detection processes. The detected data set is interleaved (block 260), and the interleaved data is decoded (block 265). In some embodiments of the present invention, the data decoding is an LDPC decoding process as is known in the art. It is then determined whether the decoding process converged (block 245), and whether there is sufficient buffering available to reprocess the data (block 250).

Where either the decoding process converged (block 245) or there is insufficient buffering available (block 250), the decoded data is de-interleaved (block 270) and stored in a buffer (block 275). The buffer includes various processed data sets that may have become available out of order, and as such the various processed data sets are reordered in the buffer so that the completed data sets may be presented at the output in the same order that the unprocessed data sets were received at the input (block 280). It is then determined if a complete time set is available in the buffer (block 285). A complete time set includes every result corresponding to received inputs over a given period of time. Thus, for example, where the first result is delayed while two later results are reported, the complete time set exists for the three results once the first result is finally available in the buffer. Where a complete time set is available (block 285), the processed data set(s) are output to a recipient (block 290).

Alternatively, where the decoding process failed to converge (block 245) and there is sufficient buffering available (block 250), the process of detection and decoding is repeated for the particular data set. In particular, the decoded data is de-interleaved (block 205) and the resulting de-interleaved data is stored to a buffer (block 210). The data is accessed from the buffer and the de-interleaved data is aligned with the corresponding sample of the data input that was stored as described above in relation to block 225 (block 215) once the data detector is available. The de-interleaved data and the corresponding sample data input is provided to the data detector where a subsequent data detection is performed (block 230) on the originally stored sample of data input (block 225) using the soft input developed in the earlier processing of the same data input (blocks 255, 260, 265, 245, 250, 205, 210, 215). The data detection of block 230 is performed using the data detection parameters previously stored in block 227. The result of the data detection process is interleaved (block 235) and the interleaved data is decoded (block 240). At this point, it is determined whether the data detection and decoding process failed to converge (block 245) and is to be repeated, or whether the result converged (block 245) and is to be reported.

Figure 3:
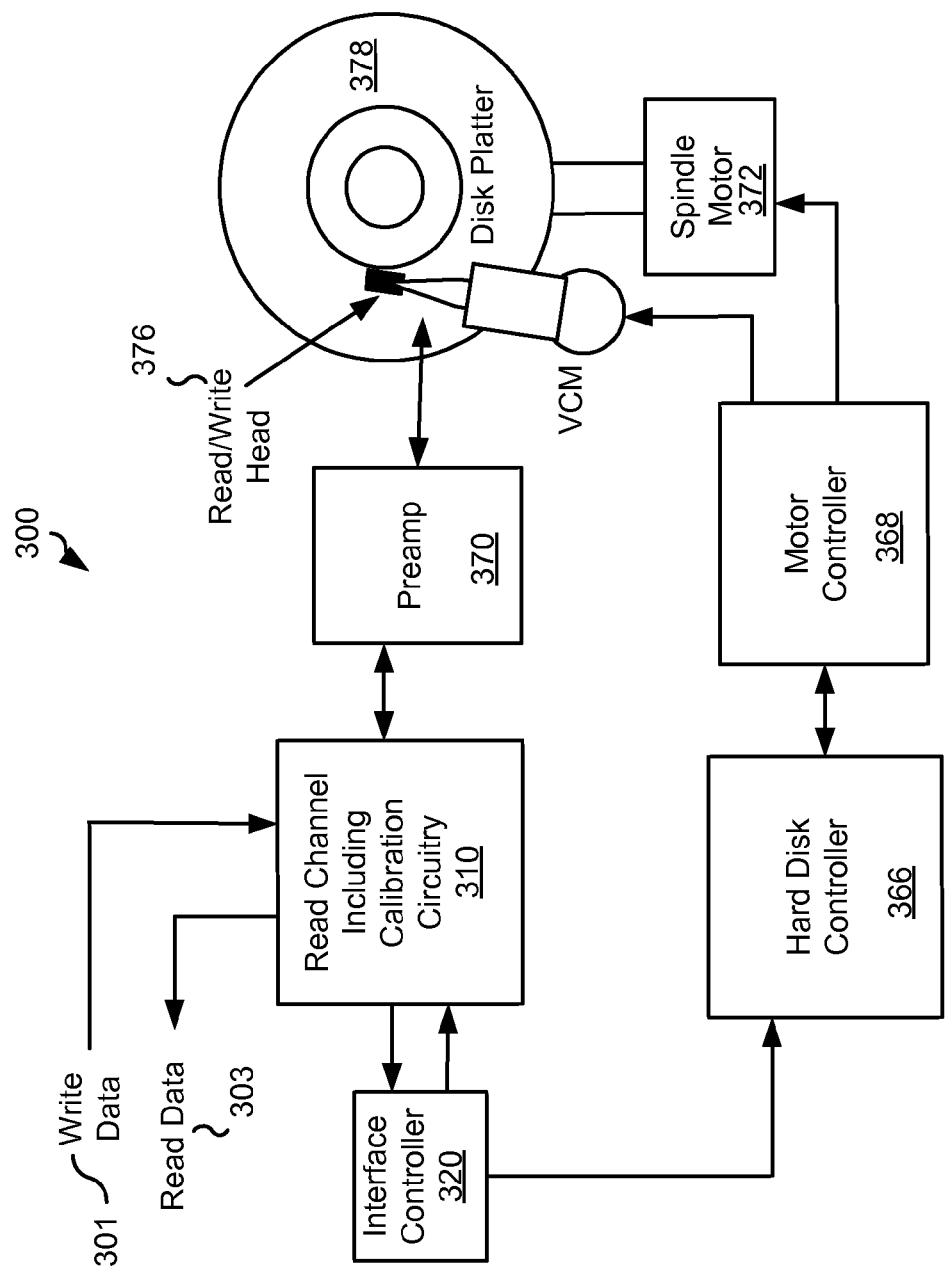
FIG. 3 depicts a storage system including distributed calibration information in accordance with various embodiments of the present invention.

Turning to FIG. 3, a storage system 300 is shown that includes a read channel 310 with calibration circuitry in accordance with various embodiments of the present invention. Storage system 300 may be, for example, a hard disk drive. Read channel 310 includes a data processing circuit with out of order codeword processing circuitry and a feed forward calibration circuit. In one embodiment of the present invention, the out of order codeword processing circuitry is similar to that described above in relation to FIG. 1. In some cases, the read channel circuit operates similar to that discussed above in relation to FIG. 2.

Storage system 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded as either longitudinal or perpendicular recorded signals.

In a typical read operation, read/write head assembly 376 is accurately positioned by motor controller 368 over a desired data track on disk platter 378. The appropriate data track is defined by an address received via interface controller 320. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 378 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel 310 via preamplifier 370. Preamplifier 370 is operable to amplify the minute analog signals accessed from disk platter 378. In turn, read channel module 310 decodes and digitizes the received analog signal to recreate the information originally written to disk platter 378. The read data is provided as read data 303. A write operation is substantially the opposite of the preceding read operation with write data 301 being provided to read channel module 310. This data is then encoded and written to disk platter 378.

In conclusion, the invention provides novel systems, devices, methods and arrangements for performing data processing. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A data processing circuit, the system comprising:
a first detector circuit, wherein the first detector circuit is operable to receive a first data set and to apply a data detection algorithm to the first data set;
a second detector circuit, wherein the second detector circuit is operable to receive a second data set and to apply the data detection algorithm to the second data set; and
a calibration circuit, wherein the calibration circuit is operable to calculate a data detection parameter based upon a third data set, and wherein the data detection parameter is used by the first detector circuit in applying the data detection algorithm to the first data set during a period that the same data detection parameter is used by the second detector circuit in applying the data detection algorithm to the second data set.

2. The data processing circuit of claim 1, wherein the circuit further comprises:
a memory, wherein the memory is operable to store the data detection parameter.

3. The data processing circuit of claim 2, wherein the first detector circuit is operable to receive the data detection parameter directly from the calibration circuit, and wherein the second detector circuit is operable to receive the data detection parameter directly from the memory.

4. The data processing circuit of claim 2, wherein the first detector circuit begins applying the data detection algorithm to the first data set before the second detector circuit begins applying the data detection algorithm to the second data set.

5. The data processing circuit of claim 1, wherein the first detector circuit applies the detection algorithm to the second data set before the second detector circuit applies the detection algorithm to the second data set.

6. The data processing circuit of claim 5, wherein the data processing circuit is an out of order data processing circuit.

7. The data processing circuit of claim 6, wherein the data 1 processing circuit is capable of finishing processing of the first data set before the second data set.

8. The data processing circuit of claim 1, wherein the calibration circuit includes a noise predictive finite impulse response filter.

9. The data processing circuit of claim 1, wherein the calibration circuit adaptively calculates the data detection parameter based upon the third data set and at least one preceding data set.

10. The data processing circuit of claim 9, wherein the at least one preceding data set includes the first data set and the second data set.

11. The data processing circuit of claim 1, wherein the data processing circuit further includes:
a decoding circuit, wherein the decoding circuit is operable to:
receive a first detected output from the first detector circuit, apply a decoding algorithm to the first detected output, and to provide the second data set; and
receive a second detected output from the second detector circuit, apply a decoding algorithm to the second detected output, and to provide a fourth data set.

12. The data processing circuit of claim 11, wherein the data decoding circuit is a low density parity check decoder circuit.

13. The data processing circuit of claim 1, wherein the first data detector circuit is selected from a group consisting of: a first soft output Viterbi algorithm detector and a first maximum a posteriori detector; and wherein the second data detector circuit is selected from a group consisting of: a second soft output Viterbi algorithm detector and a second maximum a posteriori detector.

14. A method for updating detector parameters in a data processing circuit, the method comprising:
calculating a data detection parameter based at least in part on a first data set;
applying a data detection algorithm using a first data detector circuit 4 to a second data set using the data detection parameter;
applying the data detection algorithm using the first data detector circuit to a third data set, wherein applying the data detection algorithm to the third data set by the first data detector circuit is done before applying the data detection algorithm to the second data set by the second detector circuit; and
applying the same data detection algorithm using a second data detector circuit to the third data set using the data detection parameter during a period that the first data detector circuit applies the data detection algorithm to the second data set.

15. The method of claim 14, wherein calculating the data detection parameter is done by a calculation circuit, and wherein the method further comprises:
storing the data detection parameter in a memory, wherein the second detector circuit receives the data detection parameter from the memory, and wherein the first detector circuit receives the data detection parameter directly from the calculation circuit.

16. The method of claim 15, wherein the first detector circuit receives the data detection parameter directly from the calibration circuit, and wherein the second detector circuit receives the data detection parameter directly from the memory.

17. The method of claim 16, wherein the first detector circuit begins applying the data detection algorithm to the second data set before the second detector circuit begins applying the data detection algorithm to the third data set.

18. The method of claim 14, wherein the method further comprises:
applying a decoding algorithm by a decoder circuit to the third data set after applying the data detection algorithm by the first data detector circuit to the third data set, and before applying the data detection algorithm by the second data detector circuit to the third data set.

19. The method of claim 18, wherein the decoding algorithm is a low density parity check decoding algorithm, and wherein the detection algorithm is selected from a group consisting of: a Viterbi algorithm detection algorithm and a maximum a posteriori detector algorithm.

20. A storage system, wherein the system comprises:
a storage medium, wherein the storage medium stores a first data set, a second data set and a third data set;
a read/write head assembly disposed in relation to the storage medium;
a read channel circuit, wherein the read channel circuit is operable to receive the first data set, the second data set and the third data set via the read/write head assembly, and wherein the read channel circuit includes:
a first detector circuit, wherein the first detector circuit is operable to receive the first data set and to apply a data detection algorithm to the first data set;
a second detector circuit, wherein the second detector circuit is operable to receive the second data set and to apply the data detection algorithm to the second data set; and
a calibration circuit, wherein the calibration circuit is operable to calculate a data detection parameter based upon the third data set, and wherein the data detection parameter is used by the first detector circuit in applying the data detection algorithm to the first data set during a period that the same data detection parameter is used by the second detector circuit in applying the data detection algorithm to the second data set.

* * * * *